United States Patent
Tu

(10) Patent No.: US 10,411,213 B2
(45) Date of Patent: Sep. 10, 2019

(54) WHITE LED WITH TWO BLUE LAYERS AND A YELLOW LAYER AND THE DISPLAY PANEL THEREOF

(71) Applicant: Shenzhen China Star Optoelectronics Technology Co., Ltd., Shenzhen, Guangdong (CN)

(72) Inventor: Aiguo Tu, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 0 days.

(21) Appl. No.: 15/739,704

(22) PCT Filed: Jul. 21, 2017

(86) PCT No.: PCT/CN2017/093840
§ 371 (c)(1),
(2) Date: Dec. 23, 2017

(87) PCT Pub. No.: WO2019/006784
PCT Pub. Date: Jan. 10, 2019

(65) Prior Publication Data
US 2019/0006610 A1   Jan. 3, 2019

(30) Foreign Application Priority Data
Jul. 3, 2017 (CN) .......................... 2017 1 0533596

(51) Int. Cl.
*H01L 51/50* (2006.01)
*H01L 51/00* (2006.01)

(52) U.S. Cl.
CPC ........ *H01L 51/5044* (2013.01); *H01L 51/005* (2013.01); *H01L 51/0071* (2013.01);
(Continued)

(58) Field of Classification Search
CPC ............... H01L 51/5044; H01L 51/005; H01L 51/0058; H01L 51/0067; H01L 51/0069;
(Continued)

(56) References Cited

U.S. PATENT DOCUMENTS

| 2006/0019116 A1* | 1/2006 | Conley | .................. C09K 11/06 428/690 |
| 2008/0070033 A1* | 3/2008 | Chen | .................. H01L 51/5265 428/336 |

(Continued)

FOREIGN PATENT DOCUMENTS

| CN | 1828964 A | 9/2006 |
| CN | 101044641 A | 9/2007 |

(Continued)

OTHER PUBLICATIONS

Yiquan Liu, Dongyu Gao, Jianbin Wang, et al. Research Progress of White Light Organic Light-Emitting Diodes[J]. Acta Phys. Sinica, 2015, 31(10): 1823-1852.

*Primary Examiner* — Peter Bradford
(74) *Attorney, Agent, or Firm* — Andrew C. Cheng

(57) ABSTRACT

The present disclosure relates to a white light OLED and a display panel. The OLED includes a first electrode, a first hole injection layer, a first hole transport layer, a first luminous layer, a first electron transport layer, a charge generation layer, a second hole injection layer, a second hole transport layer, an electron blocking layer, a second luminous layer, a third luminous layer, a second electron transport layer, and a second electrode stacked in sequence. The first luminous layer is a blue luminous layer, the second luminous layer is a blue luminous layer, and the third luminous layer is a yellow luminous layer. With such configuration, the color shift and the power consumption issue caused by insufficient blue light may be effectively overcome.

20 Claims, 3 Drawing Sheets

| Layer | Material |
|---|---|
| 113 | |
| 112 second electrode | Al |
| 111 second electron transport layer | BmPyPb (containing LiF) |
| 110 third luminous layer | DCZPPY: Ir(BT)2(acac) |
| 109 second luminous layer | MADN: 3%DSA-ph |
| 108 electron blocking layer | TCTA |
| 107 second hole transport layer | β-NPB |
| 106 second hole injection layer | MoO3 |
| 105 charge generation layer | BmPyPb:10%Li |
| 104 first electron transport layer | BmPyPb |
| 103 first luminous layer | MADN: 3%DSA-ph |
| 102 first hole transport layer | β-NPB |
| 101 first hole injection layer | MoO3 |
| first electrode | ITO |

(52) U.S. Cl.
CPC ........ *H01L 51/5004* (2013.01); *H01L 51/001* (2013.01); *H01L 51/0058* (2013.01); *H01L 51/0067* (2013.01); *H01L 51/0069* (2013.01); *H01L 51/0072* (2013.01); *H01L 51/5056* (2013.01); *H01L 51/5072* (2013.01); *H01L 51/5088* (2013.01); *H01L 51/5096* (2013.01); *H01L 2251/558* (2013.01)

(58) Field of Classification Search
CPC ............. H01L 51/0071; H01L 51/0072; H01L 51/5056; H01L 51/5072; H01L 51/5088; H01L 51/5096; H01L 2251/558
See application file for complete search history.

(56) References Cited

U.S. PATENT DOCUMENTS

| | | |
|---|---|---|
| 2009/0001885 A1 | 1/2009 | Spindler et al. |
| 2011/0215714 A1 | 9/2011 | Seo et al. |
| 2013/0114238 A1* | 5/2013 | Cho ..................... H01L 51/504 362/1 |
| 2014/0054571 A1* | 2/2014 | Yang ....................... H01L 51/56 257/40 |
| 2014/0084269 A1* | 3/2014 | Weaver ............... H01L 27/3209 257/40 |
| 2016/0351809 A1 | 12/2016 | Li et al. |
| 2016/0351828 A1* | 12/2016 | Wada .................. H01L 51/0052 |
| 2017/0125740 A1* | 5/2017 | Lee ....................... H01L 27/322 |
| 2017/0155071 A1* | 6/2017 | Han ....................... H01L 27/322 |
| 2017/0287985 A1* | 10/2017 | Kim ....................... H01L 25/048 |
| 2017/0352816 A1* | 12/2017 | Jeon ...................... H01L 51/0072 |
| 2018/0061901 A1* | 3/2018 | Zhang ................. H01L 27/3206 |
| 2018/0061911 A1* | 3/2018 | Sun ........................ C09K 11/06 |
| 2018/0151629 A1* | 5/2018 | Wu ..................... H01L 27/3209 |
| 2018/0233689 A1* | 8/2018 | Kim ..................... H01L 51/5088 |
| 2018/0294431 A1* | 10/2018 | Toyoda ............... H01L 51/5234 |

FOREIGN PATENT DOCUMENTS

| | | |
|---|---|---|
| CN | 102709482 A | 10/2012 |
| CN | 103633247 A | 3/2014 |
| CN | 105336872 A | 2/2016 |
| CN | 106328833 A | 1/2017 |

* cited by examiner

| U (V) | J (mA/cm2) | L (cd/m2) | CE (cd/A) | LE (lm/W) | CIE (x, y) | peak (nm) | EQE |
|---|---|---|---|---|---|---|---|
| 7.59 | 10 | 5880 | 58.8 | 20.6 | (0.335, 0.341) | 460 | 0.254 |

| U (V) | J (mA/cm2) | L (cd/m2) | CE (cd/A) | LE (lm/W) | CIE (x, y) | peak (nm) | EQE |
|---|---|---|---|---|---|---|---|
| 7.55 | 10 | 5740 | 57.40 | 20.12 | (0.335, 0.352) | 460 | 0.247 |

WHITE LED WITH TWO BLUE LAYERS AND A YELLOW LAYER AND THE DISPLAY PANEL THEREOF

BACKGROUND OF THE INVENTION

1. Field of the Invention

The present disclosure relates to OLED technology, and more particularly to a white light OLED and the display panel thereof.

2. Discussion of the Related Art

The lighting principles of OLEDs and liquid crystal display (LCD) are different. The OLEDs are characterized by attributes, such as self-luminous, wide viewing angle, high contrast, low power consumption, and high response speed time.

The structure of the OLED includes an anode (ITO), a cathode, and an organic function layer between the anode and the cathode. The organic function layer includes a hole injection layer, a hole transport layer, an organic luminous layer, an electron transport layer, and an electron injection layer.

The white light OLED generally includes a BY (Blue plus yellow) dual-layer structure. Due to the BY structure, the color of the white light may be warmer for the reason that the blue light is not enough. When the white light OLED is adopted by the OLED display or televisions, the power consumption may be increased due to the shortage of the blue light.

SUMMARY

In one aspect, a white light organic light-emitting diode (OLED) includes: a first electrode, a first hole injection layer, a first hole transport layer, a first luminous layer, a first electron transport layer, a charge generation layer, a second hole injection layer, a second hole transport layer, an electron blocking layer, a second luminous layer, a third luminous layer, a second electron transport layer, and a second electrode stacked in sequence; wherein the first luminous layer being a blue luminous layer, the second luminous layer being a blue luminous layer, and the third luminous layer being a yellow luminous layer.

In another aspect, a display panel includes the above OLED.

DETAILED DESCRIPTION OF THE EMBODIMENTS

Embodiments of the invention will now be described more fully hereinafter with reference to the accompanying drawings, in which embodiments of the invention are shown.

Figures 1, 2:
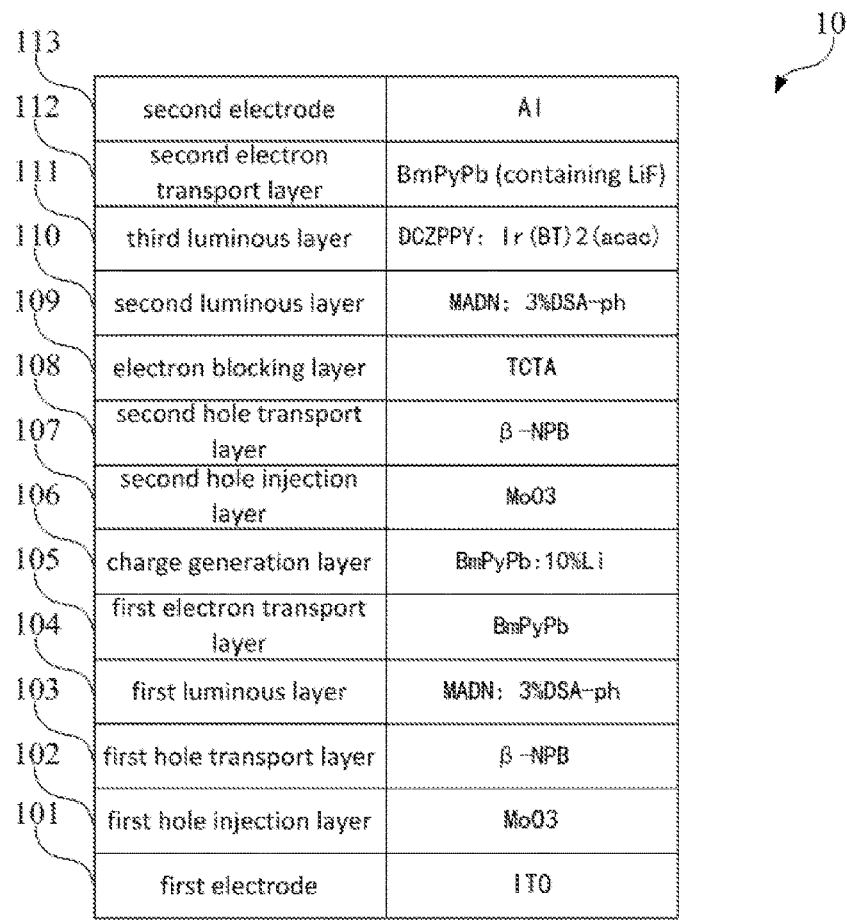
FIG. 1 is a schematic view of the OLED in accordance with a first embodiment of the present disclosure.
FIG. 2 is a parameter table of the OLED in accordance with the first embodiment of the present disclosure.

FIG. 1 is a schematic view of the OLED in accordance with a first embodiment of the present disclosure. The OLED 10 includes a first electrode 101, a first hole injection layer 102, a first hole transport layer 103, a first luminous layer 104, a first electron transport layer 105, a charge generation layer 106, a second hole injection layer 107, a second hole transport layer 108, an electron blocking layer 109, a second luminous layer 110, a third luminous layer 111, a second electron transport layer 112, and a second electrode 113 stacked in sequence.

The first electrode 101 is formed on a substrate by a sputtering method, and the other layers are formed on a surface of the next layer in sequence by a vapor deposition method. In an example, the first hole injection layer 102 is formed on a surface of the first electrode 101 by the vapor deposition method, and the first hole transport layer 103 is formed on a surface of the first hole injection layer 102 by the vapor deposition method.

The first electrode 101 is made by translucent material having high work function. In an example, the first electrode 101 is made by ITO electrode having a thickness equal to 70 nm. The hole injection layer may reduce the potential barrier between the ITO electrode and the hole transport layer to increase the adhesive degree therebetween. The first hole injection layer 102 is made by MoO3 having a thickness equal to 1 nm. The hole transport layer is configured to adjust a transmission rate and the corresponding amount of the hole. The first hole transport layer 103 is made by β-NPB (N, N-diphenyl-N, N-bis-2-naphthyl-1,1-biphenyl-4,4-diamine) having a thickness equal to 1450 nm. The first luminous layer 104 is made by MADN: 3% DSA-ph (9,10-bis (2-naphthyl)-2-methylanthracene with 3% 4,4'-(1,4 (N, N-diphenylaniline)), MADN: 3% DSA-ph is an organic substance emitting blue light in an excited state, and thickness of the first luminous layer 104 equals to 25 nm. The electron transport layer is configured to adjust the transmission rate of the electrons such that the injected electrons and the hole are recombined at the luminous layer. The first electron transport layer 105 is made of BmPyPb (1,3-bis (3,5-dipyridin-3-ylphenyl) benzene) having a thickness of 20 nm. The first charge generation layer is configured to connect the OLEDs in series. The first charge generation layer 106 is made by BmPyPb: a mixture of 10% Li 1,3-bis (3,5-di(pyridin-3-yl)phenyl) benzene and 10% lithium), and the thickness is 20 nm.

The second hole injection layer 107 woks in the same way with the first hole injection layer 102, and is made by MoO3. The thickness of the second hole injection layer 107 is 10 nm. The second hole transport layer 108 works similarly with the first hole injection layer 102. Also, the second hole transport layer 108 is made by β-NPB (N, N-diphenyl-N, N-bis-2-naphthyl-1,1-biphenyl-4,4-diamine) having a thickness equal to 15 nm. The electron blocking layer is configured to enhance a luminous efficiency of the OLED. In an example, the electron blocking layer 109 is made by TCIA (4,4',4"-tris (carbazolyl-9-yl) triphenylamine) having a thickness of 10 nm.

The second luminescent layer 110 needs to be excited out of blue light, which may be made using MADN: 3% DSA-ph 9,10-bis (2-naphthyl)-2-methylanthracene with 3% 4,4'-(1,4-phenylenedi-(1E)-2,1-ethylene diyl) bis (N, N-diphenylbenzenamine) in a thickness of 5 nm. Since the second luminous layer 110 is only necessary for the first light emitting layer to be insufficient in blue light, only a thin layer is required and the thickness is smaller than that of the first light emitting layer 102.

The third luminous layer 111 is made by DCZPPY: Ir (BT) 2 (acac) (2,6-bis ((9H-carbazol-9-yl)-3,1-phenylene) pyridine and bis (2-phenylbenzothiazole)(acetylacetonate)) with a thickness of 30 nm. DCZPPY (2,6-bis ((9H-carbazol-9-yl)-3,1-phenylene) pyridine is an organic luminescent material. When being excited, the DCZPPy emits blue light, and then being doped with Ir (BT) 2 (acac) (2-phenylbenzothiazolyl acetylacetonate), the mixture of the two may emit yellow light after being excited. The thickness of the third luminous layer 111 may be substantially equal to the thickness of the first light emitting layer 102 and may be larger than the thickness of the second luminous layer 110 so that the white light emitted from the OLED is not warm or cold.

The second electron transport layer 112 works similarly with the first electron transport layer 105. In an example, the second electron transport layer 112 is configured with the function of the electron injection layer. The second electron transport layer 112 is made by BmPyPb 1,3-bis (3,5-di (pyridin-3-yl)phenyl) benzene having a thickness of 45 nm and covered with a layer of LiF (lithium fluoride) having a thickness of 1 nm. The LiF may effectively increase the electronic transport efficiency of organic semiconductors.

In order to increase the luminous efficiency, the injection of the electrons usually requires a low work function metal or a composite metal. Thus, Al (aluminum) is adopted as the material of the second electrode 113 in one embodiment, The thickness of the second electrode 113 is 70 nm. In other embodiments, metals such as Ag (silver), Ca (calcium), Mg (magnesium) and their complexes may also be used.

The multi-layer structure may reduce the energy level barrier during the electrons and holes transition, which is beneficial to reduce the power consumption.

FIG. 2 is a parameter table of the OLED in accordance with the first embodiment of the present disclosure, wherein J represents the current density, L is the brightness, CE is the current efficiency, LE is the light efficiency, CIE is the light color coordinate, peak represents the spectral peak, EQE represents the external quantum efficiency. The external quantum efficiency refers to the ratio of the number of photons and the number of injected electrons emitted from the OLED with respect to the direction of observation. The OLED is a multilayer film structure. After the light emitted from the luminous layer passes through the absorption and reflection of many organic layers, only a small part of the light may be revealed. The internal quantum efficiency is to exclude the loss of the luminous layer after the actual luminous efficiency. The current efficiency is used to evaluate the luminescent properties of the material. The CIE is one of the basic specifications developed by the International Commission on Illumination. In the lighting area, the value of the color coordinates is configured to be as close as possible (0.33, 0.33). The color coordinates of the white light in the prior art can be achieved (0.33, 0.38). In one embodiment, the white color coordinate Y is 0.341, and the display effect is superior to the conventional white light organic electroluminescent device.

As described above, a thin blue luminous layer (i.e., the second luminous layer 109) is configured on one side of the yellow luminous layer (i.e., the third luminous layer 110) facing away from the second electrode. This configuration may effectively solve the issues, such as the blue light component is insufficient resulting warmer light color and also the power consumption issue.

Figures 3, 4:
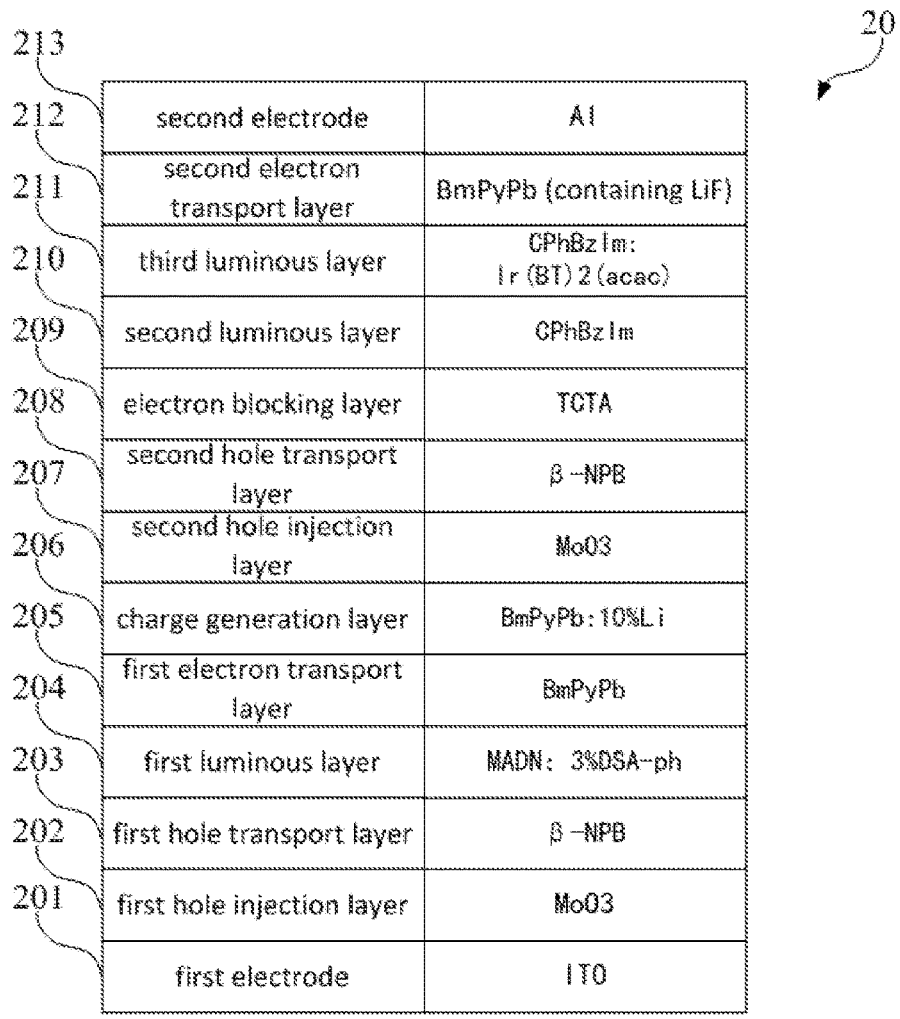
FIG. 3 is a schematic view of the OLED in accordance with a second embodiment of the present disclosure.
FIG. 4 is a parameter table of the OLED in accordance with the second embodiment of the present disclosure.

FIG. 3 is a schematic view of the OLED in accordance with a second embodiment of the present disclosure. Compared to the first embodiment, the second luminous layer 210 and the third luminous layer 211 in the second embodiment are made by different material than the first embodiment.

In the second embodiment, the second luminous layer 210 is made by CPhBzIm (9-phenyl-3,6-bis [4-(1-phenyl-1H-benzimidazolazole-2-) phenyl]-9H-carbazole) with a thickness equals to 5 nm. The third luminous layer 211 is made by CPhBzIm: Ir (BT) 2 (acac) (9-phenyl-3,6-bis [4-(1-phenyl-1H-benzimidazolazole- A mixture of 9H-carbazole and bis (2-phenylbenzothiazole) of acetylacetonate), and the thickness equals to 30 nm.

When the OLED is subjected to a forward bias from the direct current, the applied voltage energy drives the electrons and holes into the element by the cathode and the anode, respectively. When the electrons and the holes meet in the conduction, the so-called electron-hole recombination occurs. When the chemical molecules in the luminous layer are excited by external energy, if the electron spins and pairs with the ground state electrons, the molecules are in a single-line state, and emit the fluorescent light. On the other hand, if the excited state electrons and the ground state electron spin and cannot be paired, that is, the electrons and the ground state electrons are parallel, the molecules are in a triplet state, and the molecules emit phosphorescence light.

CPhBzIm is a very special material. The CPhBzIm not only can function as a dark blue fluorescent luminous layer, but also may be used as phosphorescent material. When working with yellow phosphorescent material, the luminous efficiency of CPhBzIm is also quite high. The phosphorescent material can utilize the triplet excitons formed by the triplet energy transfer mode. In addition, the phosphorescent material may form the triple excitons by the singlet state and the corresponding energy transfer mode. The triplet excitons and singlet excitons of the CPhBzIm may be utilized at the same time. Thus, the highest internal quantum efficiency can be close to 100% and the highest external quantum efficiency can be close to 25%.

In the present disclosure, the second luminous layer 109 is made by the CPhBzIm material so that the second luminous layer 109 is excited to emit blue light, and the third luminous layer 110 is a mixture material of CPhBzIm and acetylacetonate, and the second luminous layer 110 emits phosphorescent yellow.

FIG. 4 is a parameter table of the OLED in accordance with the second embodiment of the present disclosure, wherein J represents the current density, L is the brightness, CE is the current efficiency, LE is the light efficiency, CIE is the light color coordinate, peak represents the spectral peak, EQE represents the external quantum efficiency. The external quantum efficiency refers to the ratio of the number of photons and the number of injected electrons emitted from the OLED with respect to the direction of observation. The OLED is a multilayer film structure. After the light emitted from the luminous layer passes through the absorption and reflection of many organic layers, only a small part of the light may be revealed. The internal quantum efficiency is to exclude the loss of the luminous layer after the actual luminous efficiency. The current efficiency is used to evaluate the luminescent properties of the material. The CIE is one of the basic specifications developed by the International Commission on Illumination. In the lighting area, the value of the color coordinates is configured to be as close as possible (0.3, 0.3). The color coordinates of the white light in the prior art can be achieved (0.33, 0.38). In one embodiment, the white color coordinate Y is 0.352, and the display effect is superior to the conventional white light organic electroluminescent device.

As described above, the second embodiment, basing on the first embodiment, relates to adopt CphBzIm, which may emit blue fluorescent light, but may also function as phosphorescent material emitting yellow light. Thus, the triplet excitons and the singlet excitons of the CPhBzIm may be utilized at the same time. In this way, the resources may be better utilized and the power consumption may be reduced.

Figure 5:
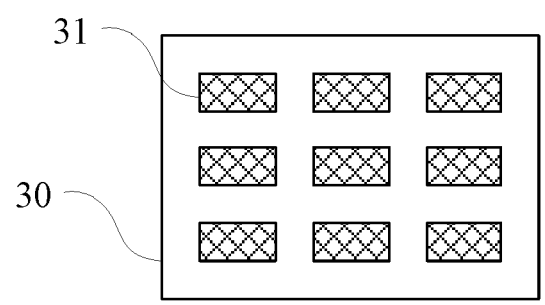
FIG. 5 is a schematic view of the display panel in accordance with one embodiment of the present disclosure.

FIG. 5 is a schematic view of the display panel in accordance with one embodiment of the present disclosure. The liquid crystal panel 30 may be an OLED panel including at least one OLED 31 in FIG. 1 or 3.

In view of the above, the blue luminous layer is configured below the yellow luminous layer, which may effectively solve the issues, such as the blue light component is insufficient resulting warmer light color and also the power consumption issue. Further, the CphBzIm, which may emit blue fluorescent light. But may also function as phosphorescent host material, is adopted. Thus, the triplet excitons and the singlet excitons of the CPhBzIm may be utilized at the same time. In this way, the resources may be better utilized and the power consumption may be reduced.

Compared to the conventional BY (Blue and yellow) structure, as the blue light component is insufficient, the light color is warmer, and the power consumption may be increased. In the present disclosure, the blue luminous layer is configured below the yellow luminous layer to enhance the strength of the blue light. Further, the CphBzIm, which may emit blue fluorescent light. But may also function as phosphorescent host material, is adopted. Thus, the triplet excitons and the singlet excitons of the CPhBzIm may be utilized at the same time so as to enhance the display performance.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A white light organic light-emitting diode (OLED), comprising:
   a first electrode, a first hole injection layer, a first hole transport layer, a first luminous layer, a first electron transport layer, a charge generation layer, a second hole injection layer, a second hole transport layer, an electron blocking layer, a second luminous layer, a third luminous layer,
   a second electron transport layer, and a second electrode stacked in sequence;
      wherein the first luminous layer is a blue luminous layer, the second luminous layer is a blue luminous layer, and the third luminous layer is a yellow luminous layer;
      the second luminous layer is configured on one side of the third luminous layer facing away the second electrode;
      the first hole injection layer, the first hole transport layer, the first luminous layer, the first electron transport layer, the first charge generation layer, the second hole injection layer, the second hole transport layer, the electron blocking layer, the second luminous layer, the third luminous layer, and the second electron transport layer, and the second electrode is formed by a vapor deposition in sequence;
      the first electron transport layer is made of 1,3-bis (3,5-di(pyridin-3-yl)phenyl); and
      the second electron transport layer is made of a layer of 1,3-bis (3,5-di(pyridin-3-yl)phenyl)benzene and a layer of lithium fluoride.

2. The OLED as claimed in claim 1, wherein:
   a thickness of the second luminous layer is smaller than the thickness of the first luminous layer; and
   the thickness of the second luminous layer is smaller than the thickness of the third luminous layer.

3. A white light organic light-emitting diode (OLED), comprising:
   a first electrode, a first hole injection layer, a first hole transport layer, a first luminous layer, a first electron transport layer, a charge generation layer, a second hole injection layer, a second hole transport layer, an electron blocking layer, a second luminous layer, a third luminous layer,
   a second electron transport layer, and a second electrode stacked in sequence;
      wherein the first luminous layer is a blue luminous layer, the second luminous layer is a blue luminous layer, and the third luminous layer is a yellow luminous layer;
      the first electron transport layer is made of 1,3-bis (3,5-di(pyridin-3-yl)phenyl); and
      the second electron transport layer is made of a layer of 1,3-bis (3,5-di(pyridin-3-yl)phenyl)benzene and a layer of lithium fluoride.

4. The OLED as claimed in claim 3, wherein the second luminous layer is configured on one side of the third luminous layer facing away the second electrode.

5. The OLED as claimed in claim 4, wherein:
   a thickness of the second luminous layer is smaller than the thickness of the first luminous layer; and
   the thickness of the second luminous layer is smaller than the thickness of the third luminous layer.

6. The OLED as claimed in claim 3, wherein:
   the second luminous layer is made by a mixture of 2-methyl-9,10-bis (naphthalen-2-yl) anthracene and 3% of 4,4'-(1,4-phenylenedi-(1E)-2, 1-ethylene diyl) bis (N, N-diphenylbenzenamine);
   the third luminous layer is made by a mixture of 2,6-bis (3-(9H-carbazol-9-yl) phenyl) pyridine and bis (2-phenylbenzothiazole)(acetylacetonate).

7. The OLED as claimed in claim 3, wherein:
   the second luminous layer is made by 9 phenyl-3,6-bis [4-(1-phenyl-1H-benzimidazolazole-2-) phenyl]-9H-carbazole;
   the third luminous layer is made by a mixture of 9-phenyl-3,6-bis [4-(1-phenyl-1H-benzimidazolazole-2-) phenyl]-9H-carbazole and bis (2-phenylbenzothiazole) (acetylacetonate).

8. The OLED as claimed in claim 3, wherein the first hole injection layer, the first hole transport layer, the first luminous layer, the first electron transport layer, the first charge generation layer, the second hole injection layer, the second hole transport layer, the electron blocking layer, the second luminous layer, the third luminous layer, and the second electron transport layer, and the second electrode is formed by a vapor deposition in sequence.

9. The OLED as claimed in claim 3, wherein the first electrode is made of indium tin oxide (ITO) transparent semiconductor material, and the second electrode is made of metallic aluminum.

10. The OLED as claimed in claim 3, wherein:
the first luminescent layer is made by a mixture of 9,10-bis (2-naphthyl)-2-methylanthracene with 3% 4,4'-(1,4-phenylenedi-(1E)-2, 1-ethylene diyl) bis (N, N-diphenylbenzenamine).

11. The OLED as claimed in claim 3, wherein:
the first hole injection is made by molybdenum trioxide;
the first hole transport layer is made of N, N-Bis-phenyl-N, N-bis-(2-naphthyl)-(1,1-biphenyl)-4,4-diamine;
the first charge generation layer is made of a mixture of 1,3-bis (3,5-di(pyridin-3-yl)phenyl)benzene and 10% lithium;
the second hole transport layer is made of N, N-Bis-phenyl-N, N-bis-(2-naphthyl)-(1,1-biphenyl)-4,4-diamine;
the electron blocking layer is made of 4,4', 4"-tris (carbazol-9-yl) triphenylamine.

12. A display panel having a plurality of OLEDs,
each of the OLEDs respectively comprising: a first electrode, a first hole injection layer, a first hole transport layer, a first luminous layer, a first electron transport layer, a charge generation layer, a second hole injection layer, a second hole transport layer, an electron blocking layer, a second luminous layer, a third luminous layer, a second electron transport layer, and a second electrode stacked in sequence;
wherein the first luminous layer is a blue luminous layer, the second luminous layer is a blue luminous layer, and the third luminous layer is a yellow luminous layer;
the first electron transport layer is made of 1,3-bis (3,5-di(pyridin-3-yl)phenyl); and
the second electron transport layer is made of a layer of 1,3-bis (3,5-di(pyridin-3-yl)phenyl)benzene and a layer of lithium fluoride.

13. The display panel as claimed in claim 12, wherein the second luminous layer is configured on one side of the third luminous layer facing away the second electrode.

14. The display panel as claimed in claim 13, wherein:
a thickness of the second luminous layer is smaller than the thickness of the first luminous layer; and
the thickness of the second luminous layer is smaller than the thickness of the third luminous layer.

15. The display panel as claimed in claim 12, wherein:
the second luminous layer is made by a mixture of 2-methyl-9,10-bis (naphthalen-2-yl) anthracene and 3% of 4,4'-(1,4-phenylenedi-(1E)-2, 1-ethylene diyl) bis (N, N-diphenylbenzenamine);
the third luminous layer is made by a mixture of 2,6-bis (3-(9H-carbazol-9-yl) phenyl) pyridine and bis (2-phenylbenzothiazole)(acetylacetonate).

16. The display panel as claimed in claim 12, wherein:
the second luminous layer is made by 9 phenyl-3,6-bis [4-(1-phenyl-1H-benzimidazolazole-2-) phenyl]-9H-carbazole;
the third luminous layer is made by a mixture of 9-phenyl-3,6-bis [4-(1-phenyl-1H-benzimidazolazole-2-) phenyl]-9H-carbazole and bis (2-phenylbenzothiazole)(acetylacetonate).

17. The display panel as claimed in claim 12, wherein the first hole injection layer, the first hole transport layer, the first luminous layer, the first electron transport layer, the first charge generation layer, the second hole injection layer, the second hole transport layer, the electron blocking layer, the second luminous layer, the third luminous layer, and the second electron transport layer, and the second electrode is formed by a vapor deposition in sequence.

18. The display panel as claimed in claim 12, wherein the first electrode is made of indium tin oxide (ITO) transparent semiconductor material, and the second electrode is made of metallic aluminum.

19. The display panel as claimed in claim 12, wherein:
the first luminescent layer is made by a mixture of 9,10-bis (2-naphthyl)-2-methylanthracene with 3% 4,4'-(1,4-phenylenedi-(1E)-2, 1-ethylene diyl) bis (N, N-diphenylbenzenamine).

20. The display panel as claimed in claim 12, wherein:
the first hole injection is made by molybdenum trioxide;
the first hole transport layer is made of N, N-Bis-phenyl-N, N-bis-(2-naphthyl)-(1,1-biphenyl)-4,4-diamine;
the first charge generation layer is made of material of a mixture of 1,3-bis (3,5-di(pyridin-3-yl)phenyl)benzene and 10%
the second hole injection layer being made of molybdenum trioxide material;
the second hole transport layer is made of N, N-Bis-phenyl-N, N-bis-(2-naphthyl)-(1,1-biphenyl)-4,4-diamine;
the electron blocking layer is made of 4,4',4"-tris (carbazol-9-yl) triphenylamine.

* * * * *